United States Patent [19]
Paulus et al.

[11] Patent Number: 6,037,817
[45] Date of Patent: Mar. 14, 2000

[54] APPARATUS AND METHOD FOR DIGITAL DELAYS WITHOUT DEAD TIME

[75] Inventors: Michael J. Paulus, Knoxville; John T. Mihalczo, Oak Ridge, both of Tenn.

[73] Assignee: Lockheed Martin Energy Research Corporation, Oak Ridge, Tenn.

[21] Appl. No.: 08/906,626

[22] Filed: Aug. 7, 1997

[51] Int. Cl.$^7$ .................................................. H03H 11/26
[52] U.S. Cl. .......................... 327/265; 327/261; 327/276; 327/279
[58] Field of Search ..................................... 327/261, 263, 327/265, 276, 278, 279, 392, 398, 407, 197, 227

[56] References Cited

U.S. PATENT DOCUMENTS

| | | | |
|---|---|---|---|
| 3,619,669 | 11/1971 | Wheeler | 327/276 |
| 4,800,304 | 1/1989 | Takeuchi | 327/279 |
| 5,589,788 | 12/1996 | Goto | 327/276 |
| 5,606,276 | 2/1997 | McClintock | 327/263 |
| 5,646,568 | 7/1997 | Sato | 327/276 |

OTHER PUBLICATIONS

Circuit Design for MOS VLSI (1992)Kluwer Academic Publishers; Chapter 7, pp. 275–278.
A.K. Tickoo, C.L. Batt, R. Koul, I.K. Kaul, S.K. Kaul, S.R. Kaul; "A Computer–Programmable Delay–Generator Scheme for the TACTIC Gamma–Ray Telescope", *Nuclear Instruments and Methods in Physics Research*, A 349, (1994) p. 600–608, North Holland.

*Primary Examiner*—Timothy P. Callahan
*Assistant Examiner*—An T. Luu
*Attorney, Agent, or Firm*—Quarles & Brady LLP

[57] ABSTRACT

A digital pulse delay system comprises: a counter incremented responsive to a succession of input pulses and generating a plurality of successive gating signals; a plurality of gates, each having a first input for receiving said input pulses and a second input the receiving a different one of said gating signals; a plurality of pulse delay circuits providing uniform time delays, each receiving an output pulse from a different one of said gates; and, an output circuit combining said uniformly delayed pulses from all of said delay circuits into a single output signal representing a uniformly delayed version of said succession of input pulses. A method for digitally delaying a signal of spaced pulses comprises the steps of: digitally generating a control sequence responsive to said spaced pulses; successively and uniformly digitally delaying successive ones of said spaced pulses in parallel, responsive to said control sequence; and, digitally combining said uniformly delayed pulses into a single output signal representing a uniformly delayed version of said digital signal.

18 Claims, 5 Drawing Sheets

APPARATUS AND METHOD FOR DIGITAL DELAYS WITHOUT DEAD TIME

BACKGROUND OF THE INVENTION

1. Field of the Invention

This invention relates to the field of digital delay systems for digital pulse signals, and in particular, to digital delay systems for very closely spaced pulses.

2. Description of Related Art

Digital signal processing often requires the transmission of closely spaced digital pulses. Digital signal processing also frequently requires that signals having such closely spaced pulses must be delayed. The delay of closely spaced digital pulses by conventional digital delay circuits is unsatisfactory, because active delay circuits have dead times, during which such circuits cannot respond to a following pulse until a preceding pulse has been propagated through the delay circuit. As digital circuits run at faster and faster clock rates, the time interval between the pulses of a signal which must be delayed become shorter than the dead time of the active delay circuit. No matter how fast the response time of the active delay circuit becomes, and how short the dead time becomes, it can be expected that the interval between pulses to be delayed will be shorter than the dead time. An altogether new approach is required.

SUMMARY OF THE INVENTION

In accordance with an inventive arrangement, the effect of dead time of the active delay circuits can be avoided altogether by multiplexing the closely spaced pulses through a plurality of active delay circuits in parallel. In this arrangement, each successive pulse is propagated through a different "not-busy" parallel path. The output signals of the parallel paths are combined into a single output signal in which the time intervals between pulses of the original signal have been precisely preserved. The number of parallel paths required will depend upon the length of the delay, the time intervals between pulses and the pulse rate.

In accordance with another inventive arrangement, the pulses to be delayed are regenerated, or conditioned, before the parallel processing with a predetermined dead time, to prevent pulses from being supplied too quickly to the parallel paths.

In accordance with still another inventive arrangement, the delay can be adjustable, for example in the range of approximately 1 nanosecond (nsec) to 2 microseconds ($\mu$sec).

In accordance with yet another inventive arrangement, the delay system can be embodied in an integrated circuit, for example, an application specific integrated circuit (ASIC).

A digital pulse delay system, in accordance with the inventive arrangements, comprises: a counter incremented responsive to a succession of input pulses and generating as an output a plurality of successive input gating signals as said counter increments; a plurality of logical gates, each of said gates having a first input coupled for receiving said input pulses and a second input for receiving a different one of said successive input gating signals; a plurality of pulse delay circuits providing uniform time delays, each coupled for receiving an output pulse from a different one of said logical gates; and, an output circuit coupled for receiving said uniformly delayed pulses from all of said delay circuits and combining all of said delayed pulses into a single output signal representing a uniformly delayed version of said succession of input pulses. The counter and the plurality of logical gates can be thought of as a control circuit.

The delay circuits operate independently of one another, and the system comprises a sufficient number of the delay circuits that no one of the delay circuits is supplied with one of the input pulses during a dead time resulting from a previously supplied pulse.

A pulse conditioner regenerates the input pulses, the regenerated input pulses being routed to the plurality of delay circuits. The pulse conditioner has a predetermined dead time when responding to the succession of input pulses, the predetermined dead time being related to operation of the delay circuits and the control circuit. The pulse conditioner, which is responsive to a respective edge transition of each of the succession of input pulses, can comprise a monostable multi vibrator.

Each of the pulse delay circuits is preferably a regulated, variable delay circuit. A pulse shaping circuit, for example a monostable multi vibrator, is responsive to each of the delay circuits.

The output circuit can comprise a logical gate performing an "OR" function.

The system can be embodied in an integrated circuit, for example, an application specific integrated circuit.

A method for delaying a digital signal of spaced pulses, in accordance with the inventive arrangements, comprises the steps of: generating a control sequence responsive to said spaced pulses; successively uniformly delaying successive ones of said spaced pulses in parallel, in accordance with said control sequence; and, combining said uniformly delayed pulses into a single output signal representing a uniformly delayed version of said digital signal of said spaced pulses.

The spaced pulses can be regenerated before the delaying step and the control sequence can be generated responsive to the regenerated pulses for controlling the delaying step.

The spaced pulses can also be regenerated with a predetermined dead time before the delaying step. The predetermined dead time of the regenerated pulses, the control sequence and respective dead time associated with the delaying step can be correlated with one another.

The delayed pulses can be regenerated before the combining step.

DETAILED DESCRIPTION OF THE PREFERRED EMBODIMENTS

Figure 1:
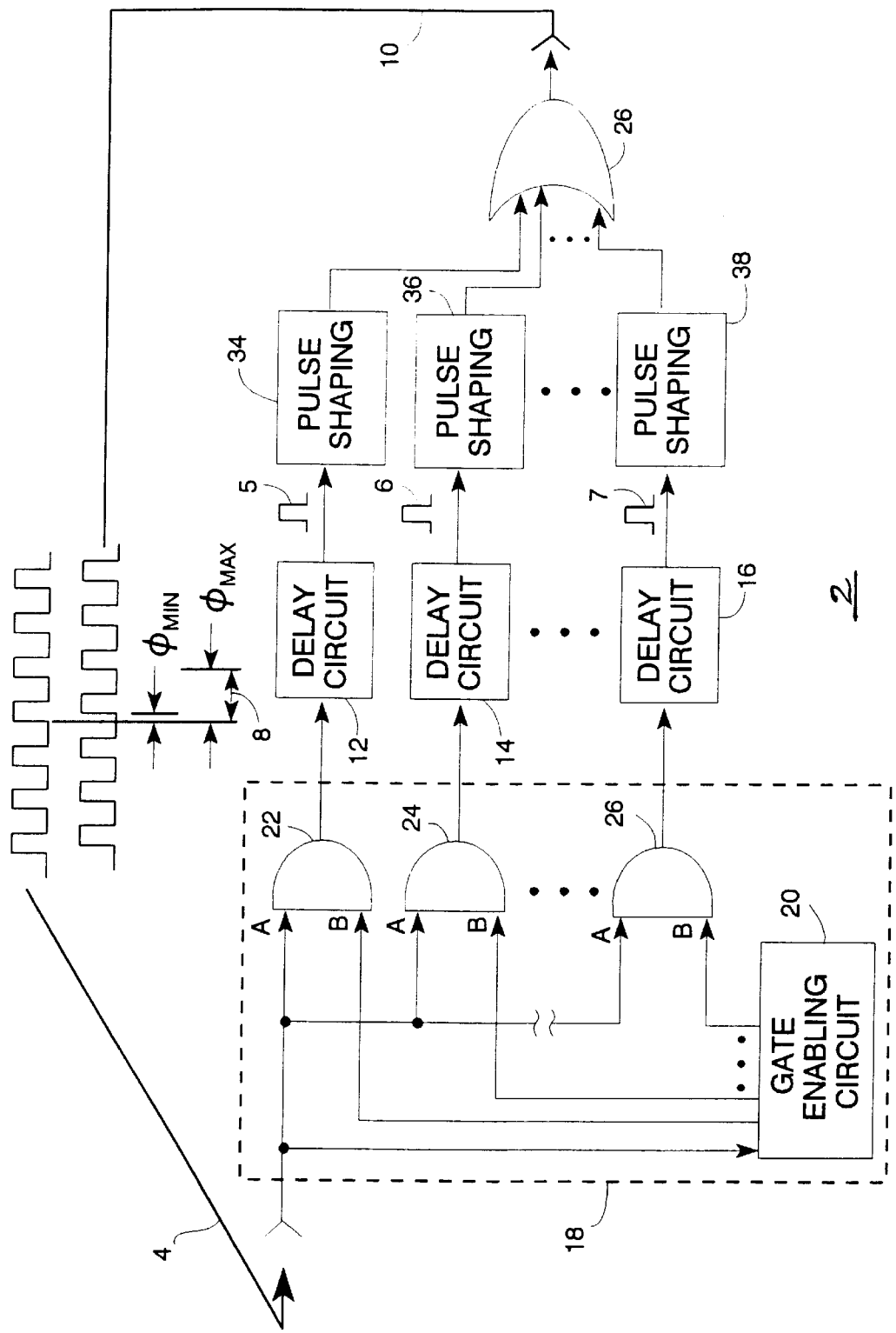
FIG. 1 is a block diagram of a pulse delay system according to an inventive arrangement.

A digital pulse delay system 2 in accordance with an inventive arrangement is shown in FIG. 1. The digital pulse delay system 2 successively delays each pulse of an input digital pulse signal 4, in order to generate an output digital pulse signal 10, wherein each pulse of the output signal 10 is a delayed version of a pulse of the input signal 4. Accordingly, output signal 10 is, in whole, a delayed version of input signal 4. In accordance with an inventive arrangement, the delay 8 is adjustable, from a minimum delay of $\phi_{MIN}$ to a maximum delay of $\phi_{MAX}$.

The delay system 2 firstly comprises a plurality of pulse delay circuits, three of which are shown and designated by reference numerals 12, 14, . . . , 16. The delay system secondly comprises a control circuit 18 for routing a succession of the input pulses of signal 4 to successive ones of the delay circuits. The delay circuits 12, 14, . . . , 16 successively generate delayed pulses, designated by reference numeral 5, 6, . . . , 7 responsive to different ones of the succession of input pulses. The delay system 2 thirdly comprises an output circuit 26 for combining all of the delayed pulses into the single output signal 10 representing the delayed version of the input pulse signal 4. The output circuit 26 is embodied as a logical gate performing an "OR" function. The depiction of a single OR gate is exemplary of any logical gate or interconnected logical gates which perform the same function.

The delay circuits 12, 14, . . . , 16 operate independently of one another. The system 2 comprises a sufficient number of the delay circuits that no one of the delay circuits is supplied with one of the input pulses during a dead time resulting from a previously supplied input pulse. The delay circuits are preferably regulated delay circuits, and n particular, are preferably variable, regulated delay circuits. In the event that variable delay circuits are utilized, it is important that each of the parallel delay circuits be adjusted for the same delay at the same time.

The delay circuits tend to distort the pulses to some extent. Accordingly, pulse shaping circuits 34, 36, . . . , 38 receive the delayed pulses 5, 6, . . . ., 7, respectively, and generate clean pulses for constructing the output signal. The pulse shaping circuits are preferably monostable multi vibrators, for example one-shorts, which provide the flexibility of controlling the width of the output pulses.

The pulses of the input signal 4 are routed to the different delay circuits by the control circuit 18, which is responsive to the pulses of the input signal 4. The control circuit 18, comprises a gate enabling circuit 20 and a plurality of logical gates responsive to the gate enabling circuit. The gate enabling circuit sequentially selects delay circuits, or pathers, to process an input pulse.

Figure 3:
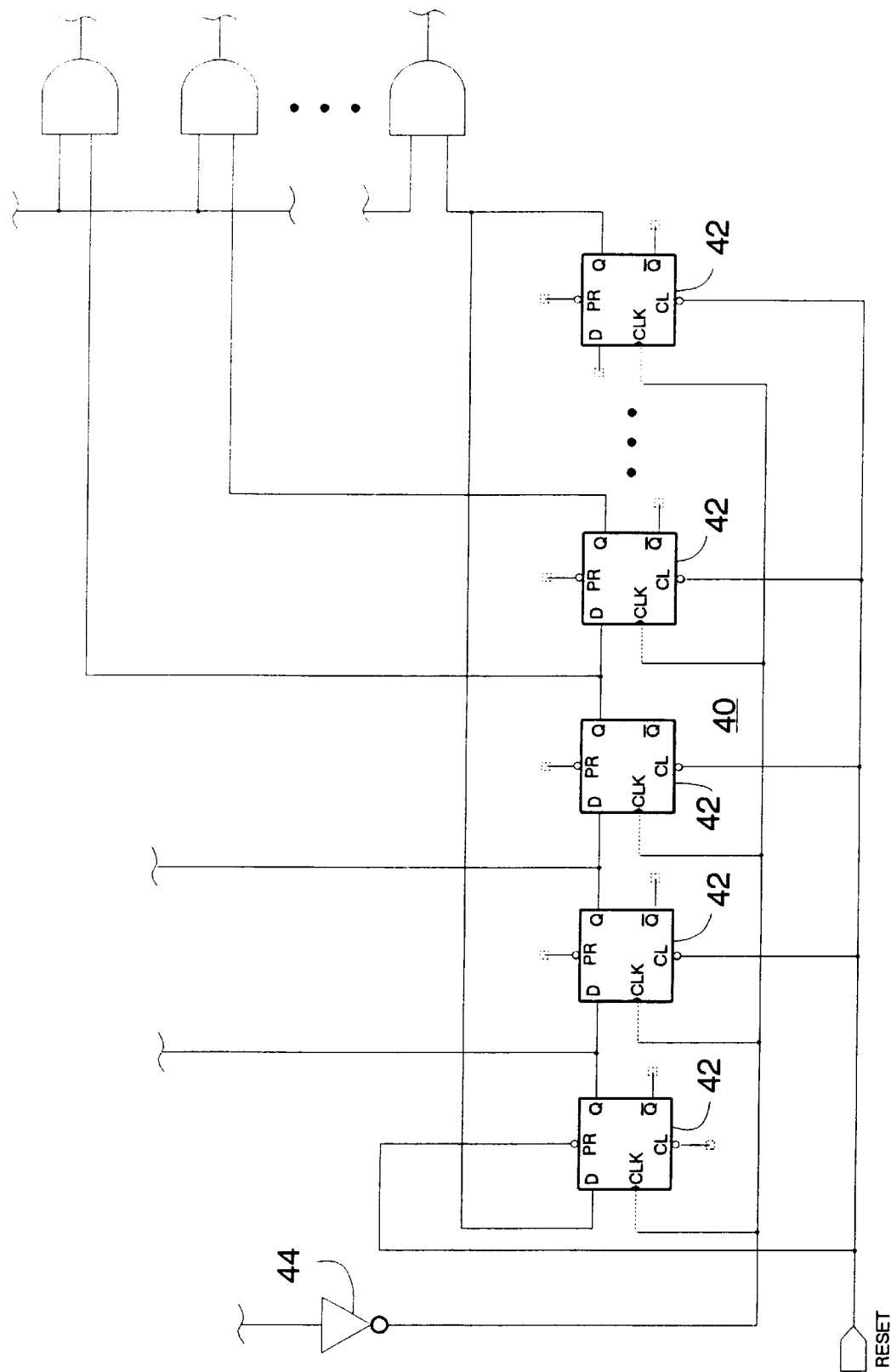
FIG. 3 is a block diagram of the gate enabling circuit shown in FIGS. 1 and 2.

In the presently preferred embodiment, the gate enabling circuit comprises an array 40 of flip/flops 42, for example D-type flip/flops, as shown in FIG. 3. Each flip/flop 42 forms a counting stage of a counter. The flip/flop array 40 is configured so that one and only one of the flip/flops 42 has a logically high Q output at the same time. On the falling edge of each input pulse, which is buffered and inverted by a logical gate 44 implementing a logical "INVERT" function, the flip/flop array 40 is clocked, causing that one of the flip/flops with the logically high Q output to undergo a transition to a logically low Q output, and causing the next flip/flop in the array to undergo a transition to a logically high Q output. The counter is incremented responsive to the input pulses and generates a plurality of successively enabled output gating signals as the counter increments, providing a control sequence for proper pulse routing to the different delay circuits. The array is also provided with a source of a Reset signal coupled to each flip/flop. The Reset signal presets the first flip/flop to a logical high, and clears the remaining flip/flops to a logical low.

Each of the plurality of logical gates performs an "AND" function. Each of the gates has a first input coupled for receiving the input pulses and a second input for receiving a different one of the successively enabled output gating signals. Each of the logical gates has an output coupled to a respective one of the plurality of delay circuits. In the presently preferred embodiment, the array comprises AND gates. The depiction of separate AND gates is exemplary of any logical gate or interconnected logical gates which perforate same function, including, for example, NAND gates.

The pulse delay circuits 12, 14, . . . 16 generate an output a fixed time after a logic high appears at its input. The delay of an appropriate delay circuit will remain constant despite the variation of any number of a plurality of important parameters, including for example, temperature, power supply voltage and data rate. Numerous pulse delay circuits can be constructed to meet this criteria, and three examples are shown respectively in FIGS. 4, 5 and 6.

Figure 4:
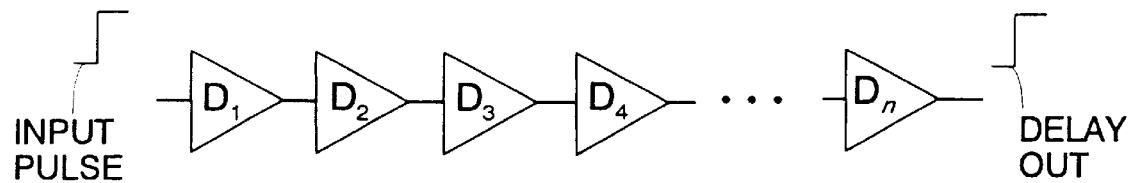
FIGS. 4, 5 and 6 illustrate alternative pulse delay circuits, as shown in FIGS. 1 and 2.

FIG. 4 illustrates a multi-gate delay. The pulse delay circuit comprises a series of n logical gates D1, D2, D3, D4, . . . , Dn, each with an identical propagation delay $t_p$. Different numbers n of the gates can be configured to achieve a total delay $t_d$ of $t_d=n*t_p$.

Figure 5:
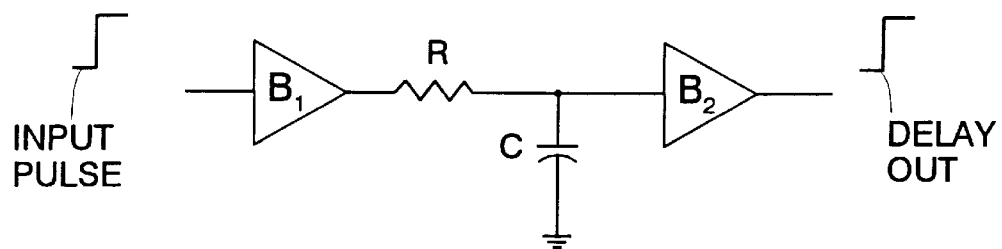

FIG. 5 illustrates a resistor-capacitor delay. A circuit comprising two buffers B1 and B2 and a resistive-capacitive network will exhibit a time delay which is largely determined by the RC product of the network.

Figure 6:
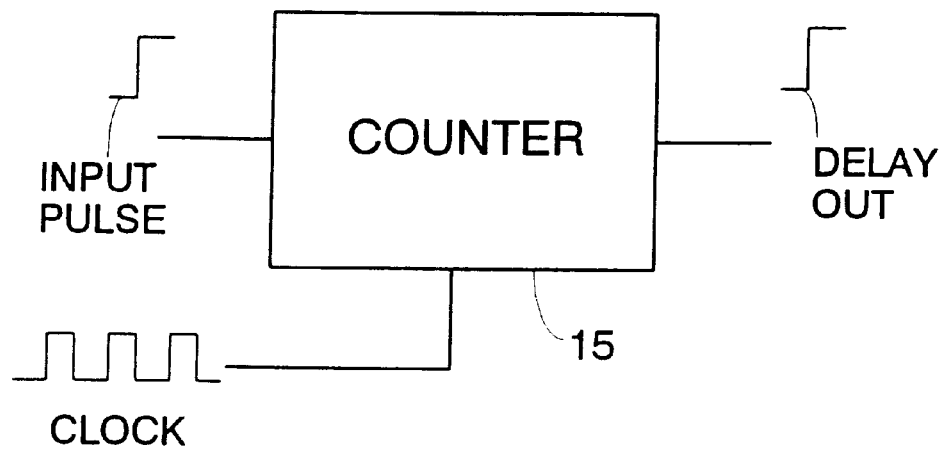

FIG. 6 illustrates a counter delay, in which a counter 15 generates a logically high output n clock periods after a logical high appears at the input.

It will be appreciated that the control sequence and respective dead times associated with the delaying step must be correlated with one another to prevent each of the delay circuits being supplied with one of the input pulses during a dead time resulting from a previously supplied input pulses. The required number of parallel paths with the delay circuits will depend upon the length of the delay, the time intervals between pulses and the pulses rate.

Figure 2:
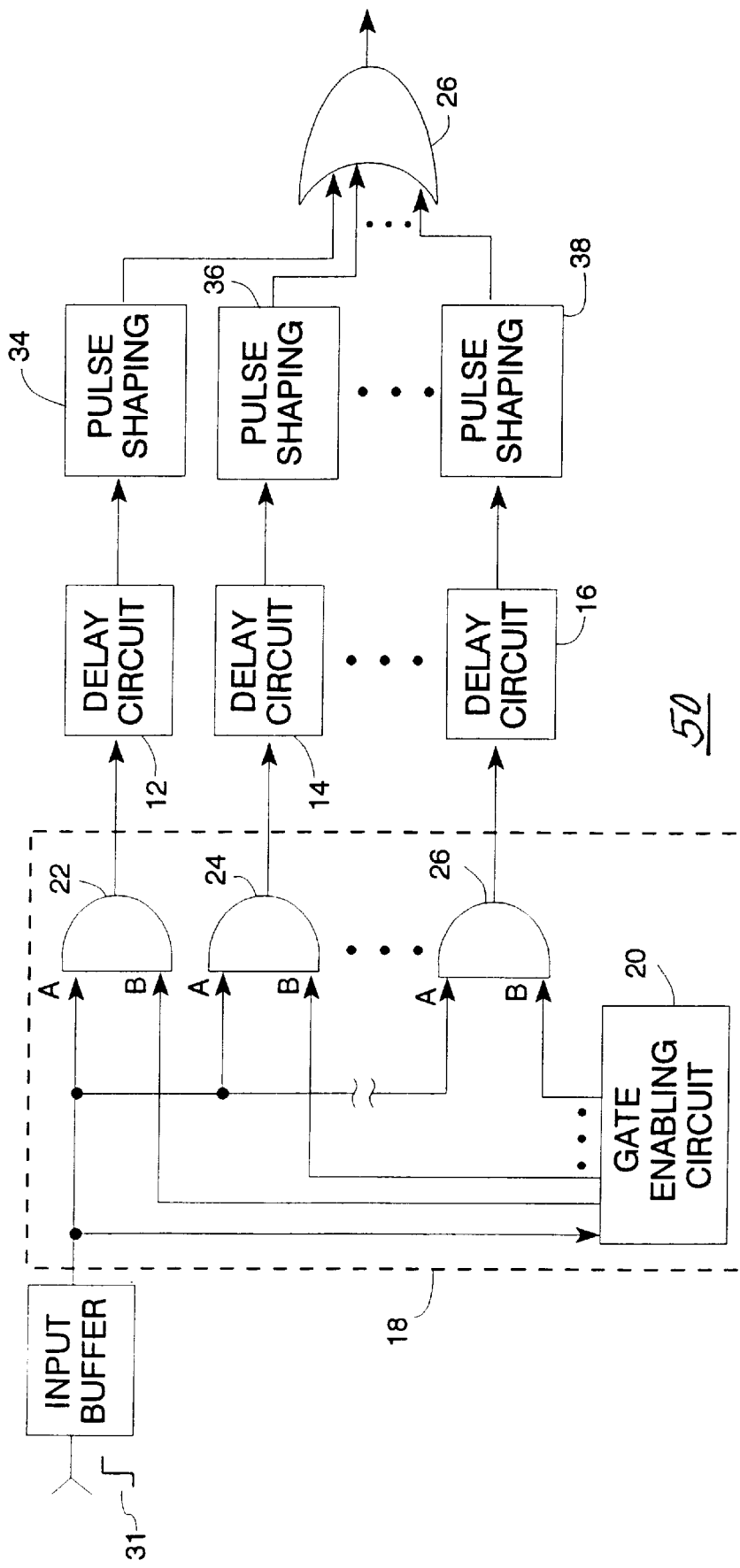
FIG. 2 is a block diagram of a pulse delay system according to a further inventive arrangement.
Figure 7:
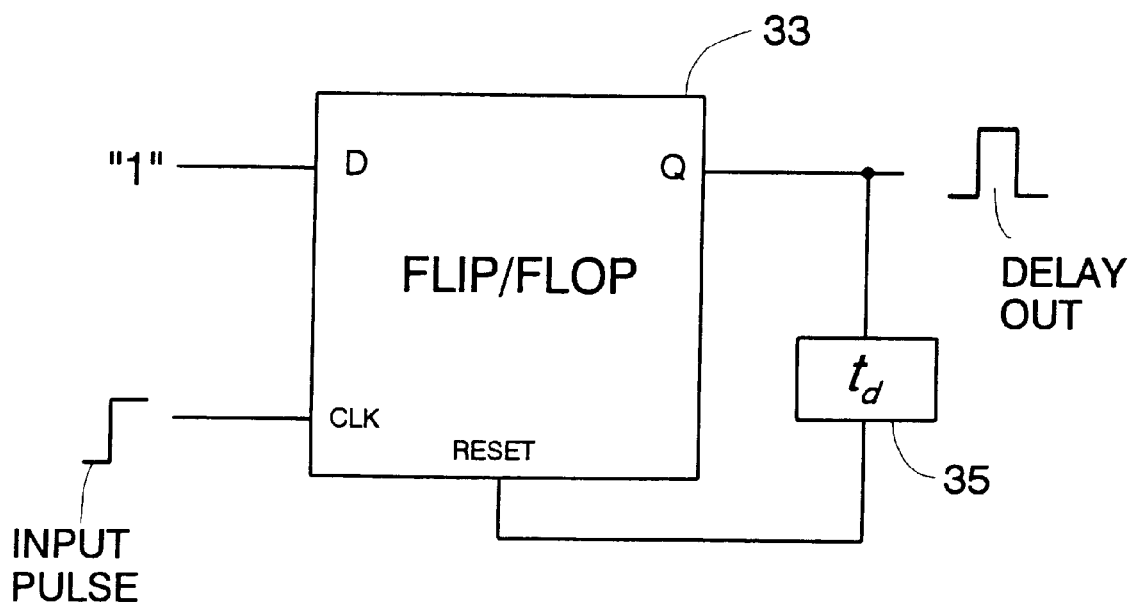
FIG. 7 illustrates of a buffer circuit, as shown in FIG. 2.

A digital pulse delay system 50 in accordance with another inventive arrangement is shown in FIG. 2. The digital pulse delay system 50 is in every respect the same as system 2 shown in FIG. 1, except for further comprising an input buffer 30 for receiving the input signal 4. The input buffer 30 functions as a pulse conditioner for regenerating the input pulses. In this arrangement, it is the regenerated, or conditioned, input pulses which are routed to the plurality of delay circuits and the gate enabling circuit in the control circuit. The pulse conditioner or buffer 30 has a predetermined dead time when responding to the succession of input pulses, the predetermined dead time being related to operation of the delay circuits and the control circuit. The pulse conditioner, which can be responsive to a respective edge transition 31 of each of the succession of input pulses, can comprise a monostable multi vibrator, for example a one-shot. A suitable one-shot provides an output pulse of fixed width when an input pulse of any width is detected. A simple one-shot using a D-type flip/flop 33 can be configured as shown in FIG. 7. The D input is tied logically high and the clock input is edge sensitive. When an input clock edge is detected, corresponding to the leading edge of an input pulse to be delayed, the Q output undergoes a transition to a logical high. The Q output drives a digital delay 35, which in turn resets the flip/flop 33. Thus, the output width is set by the delay period $t_d$. The flip/flop 33 is held in reset for the period $t_d$ because the reset signal is a delayed copy of the Q output pulse. Accordingly, the total one-shot dead time is $2t_3$ per input pulse. The dead time can be predetermined to prevent pulses from being supplied too quickly to the parallel paths.

It will be appreciated that the predetermined dead time of the regenerated pulses, the control sequence and respective dead times associated with the delaying step must be correlated with one another to prevent each of the delay circuits being supplied with one of the input pulses during a dead time resulting from a previously supplied input pulse.

A method for delaying a digital signal of spaced pulses, particularly closely spaced pulses, is also provided in accordance with yet another inventive arrangement. The method comprises the steps of: independently delaying successive ones of the pulses in parallel; and, combining the independently delayed pulses into a single output signal. A control sequence can be generated responsive to the pulses for controlling the delaying step.

Alternatively, the spaced pulses can be regenerated before the delaying step and a control sequence can be generated responsive to the regenerated pulses for controlling the delaying step.

The spaced pulses are advantageously regenerated with a predetermined dead time before the delaying step. A control sequence can be generated responsive to the regenerated pulses for controlling the delaying step. The predetermined dead time of the regenerated pulses, the control sequence and respective dead times associated with the delaying step can be correlated with one another.

The delayed pulses can be regenerated before the combining step, for example, for purposes of pulse shaping.

Representative circuit parameters are helpful in understanding how the required number of parallel delay paths can be determined, in accordance with the inventive arrangements taught herein. Consider a system where a 1 msec delay is required and a maximum pulse rate of 100,000 Hz is anticipated. The system dead time per pulse must be less than $1/100,000$ sec. or less than 10 $\mu$sec. The dead time associated with the input buffer, or one-shot, must therefore be less than 10 $\mu$sec.

The minimum number of parallel channels (#C's) required is given by the product of the delay and the maximum count rate. In this case: #C's=1 msec * 100,000 Hz=100 channels.

Thus, a minimum design to meet the requirements of a 1 msec delay and a 100,000 Hz input pulse rate would have a dead time less than 10 $\mu$sec and at least 100 parallel delay channels.

What is claimed is:

1. A digital pulse delay system, comprising:

a pulse conditioner for regenerating a succession of input pulses, said pulse conditioner having a predetermined dead time;

a counter incremented responsive to said succession of regenerated input pulses and generating as an output a plurality of successive input gating signals as said counter increments;

a plurality of logical gates, each of said gates having a first input coupled for receiving said regenerated input pulses and a second input for receiving a different one of said successive input gating signals;

a plurality of pulse delay circuits providing uniform time delays, each coupled for receiving an output pulse from a different one of said logical gates, said predetermined dead time of said pulse conditioner being related to operation of said plurality of pulse delay circuits; and an output circuit coupled for receiving said uniformly delayed pulses from all of said delay circuits and combining all of said delayed pulses into a single output signal representing a uniformly delayed version of said succession of input pulses.

2. The system of claim 1, wherein said pulse conditioner is responsive to a respective edge transition of each of said succession of input pulses.

3. The system of claim 1, wherein said pulse conditioner comprises a monostable multi vibrator.

4. The system of claim 1, wherein each of said pulse delay circuits comprises a regulated, variable delay circuit.

5. The system of claim 4, further comprising a pulse shaping circuit responsive to each said delay circuit and supplying pulse-shaped delayed pulses to said output circuit.

6. The system of claim 1, further comprising a pulse shaping circuit responsive to each said delay circuit and supplying pulse-shaped delayed pulses to said output circuit.

7. The system of claim 1, wherein each of said logical gates performs an "AND" function.

8. The system of claim 1, wherein said output circuit performs an "OR" function.

9. The system of claim 1, wherein said delay circuits operate independently of one another.

10. The system of claim 1, comprising a sufficient number of said delay circuits that no one of said delay circuits is supplied with one of said input pulses during a dead time resulting from a previously supplied input pulse.

11. The system of claim 1, embodied in an integrated circuit.

12. The system of claim 1, embodied in an application specific integrated circuits.

13. A method for delaying a digitally signal of spaced pulses, comprising the steps of:

regenerating said spaced pulses;

generating a control sequence responsive to said regenerated pulses;

successively uniformly delaying successive ones of said regenerating pulses in parallel, in accordance with said control sequence; and, combining said uniformly delayed pulses into a single output signal representing a uniformly delayed version of said digital signal of said spaced pulses.

14. The method of claim 13, further comprising the step of regenerating said spaced pulses with a predetermined dead time.

15. The method of claim 13, further comprising the steps of:

delaying said successive ones of said regenerated pulses with respective dead times;

regenerating said spaced pulses with a predetermined dead time; and, correlating with one another said predetermined dead time of said regenerated pulses and said respective dead times associated with said delaying step.

16. The method of claim 13, further comprising the step of uniformly adjusting said parallel delaying.

17. The method of claim 13, further comprising the step of pulse shaping said uniformly delayed pulses prior to said combining step.

18. The method of claim 13, further comprising the step of increasing a counter responsive to said space pulses to generate said control sequence.

* * * * *